(12) United States Patent
Chiang et al.

(10) Patent No.: US 9,356,008 B2
(45) Date of Patent: May 31, 2016

(54) SEMICONDUCTOR PACKAGE AND FABRICATION METHOD THEREOF

(71) Applicant: Siliconware Precision Industries Co., Ltd., Taichung (TW)

(72) Inventors: Cheng-Chia Chiang, Taichung (TW); Hsin-Ta Lin, Taichung (TW); Fu-Tang Huang, Taichung (TW); Yu-Po Wang, Taichung (TW); Lung-Yuan Wang, Taichung (TW); Chu-Chi Hsu, Taichung (TW); Chia-Kai Shih, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/616,013

(22) Filed: Feb. 6, 2015

(65) Prior Publication Data

US 2016/0020195 A1 Jan. 21, 2016

(30) Foreign Application Priority Data

Jul. 17, 2014 (TW) .............................. 103124500 A (51) Int. Cl.
| | |
|---|---|
| *H01L 25/16* | (2006.01) |
| *H01L 25/00* | (2006.01) |
| *H01L 23/00* | (2006.01) |
| *H01L 23/42* | (2006.01) |
| *H01L 23/31* | (2006.01) |

(52) U.S. Cl.
CPC .......... *H01L 25/162* (2013.01); *H01L 23/3157* (2013.01); *H01L 23/42* (2013.01); *H01L 23/562* (2013.01); *H01L 23/564* (2013.01); *H01L 24/11* (2013.01); *H01L 24/14* (2013.01); *H01L 25/50* (2013.01); *H01L 2224/12105* (2013.01); *H01L 2224/141* (2013.01); *H01L 2224/1401* (2013.01); *H01L 2225/06513* (2013.01); *H01L 2225/06548* (2013.01)

(58) Field of Classification Search
USPC ......................................... 257/738
See application file for complete search history.

(56) References Cited

U.S. PATENT DOCUMENTS

| | | | | |
|---|---|---|---|---|
| 7,432,596 | B1 * | 10/2008 | Bone .............................. | 257/747 |
| 2014/0008787 | A1 * | 1/2014 | Chan et al. ..................... | 257/737 |

* cited by examiner

*Primary Examiner* — Thao P Le
(74) *Attorney, Agent, or Firm* — Mintz Levin Cohn Ferris Glovsky and Popeo, P.C.; Peter F. Corless; Steven M. Jensen (57) ABSTRACT

A semiconductor package is provided, which includes: a first semiconductor device having a first top surface and a first bottom surface opposite to the first top surface; a plurality of conductive balls formed on the first top surface of the first semiconductor device; a second semiconductor device having a second top surface and a second bottom surface opposite to the second top surface; and a plurality of conductive posts formed on the second bottom surface of the second semiconductor device and correspondingly bonded to the conductive balls for electrically connecting the first semiconductor device and the second semiconductor device, wherein the conductive posts have a height less than 300 um. Therefore, the present invention can easily control the height of the semiconductor package and is applicable to semiconductor packages having fine-pitch conductive balls.

20 Claims, 8 Drawing Sheets

SEMICONDUCTOR PACKAGE AND FABRICATION METHOD THEREOF

CROSS-REFERENCE TO RELATED APPLICATIONS

This application claims under 35 U.S.C. §119(a) the benefit to Taiwanese Application No. 103124500, filed Jul. 17, 2014, the entire contents of which are incorporated herein by reference.

BACKGROUND OF THE INVENTION

1. Field of the Invention

The present invention relates to semiconductor packages and fabrication methods thereof, and more particularly, to a stack-type semiconductor package having conductive posts and conductive balls for electrical connection and a fabrication method thereof.

2. Description of Related Art

In a stack-type semiconductor package, a plurality of solder balls are formed on upper and lower substrates and bonded together to electrically connect the upper and lower substrates. The height of the semiconductor package and the gap between the upper and lower substrates are controlled through the solder balls.

However, since the solder balls easily collapse during a reflow process, the height of the semiconductor package is difficult to control. Further, a large space is required at joints of the solder balls. Therefore, such a stack-type semiconductor package cannot meet the fine-pitch requirement.

Figure 1A:
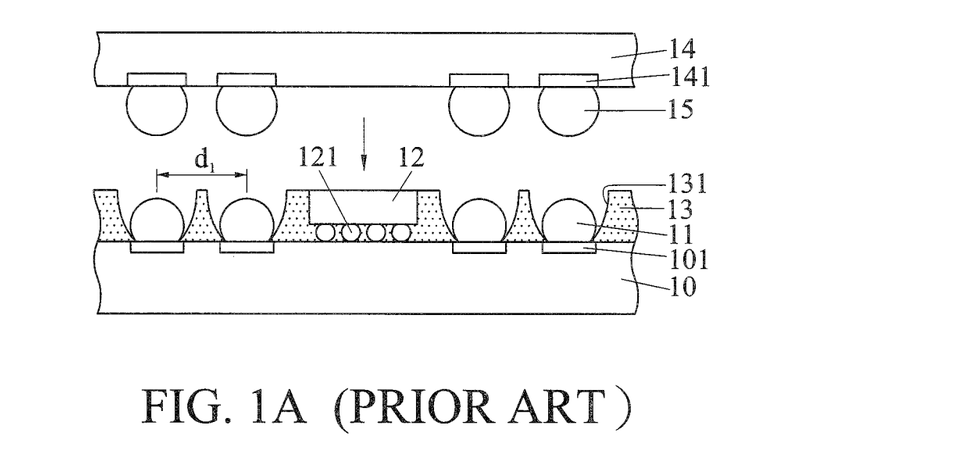
FIGS. 1A and 1B are schematic cross-sectional views showing a semiconductor package and a fabrication method thereof according to the prior art.
Figure 1B:
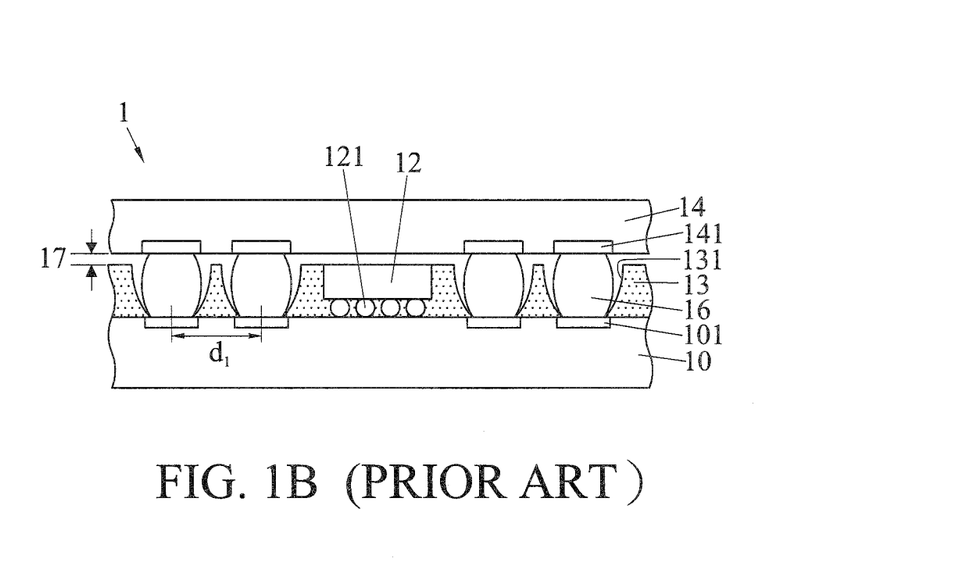

FIGS. 1A and 1B are schematic cross-sectional views showing a semiconductor package 1 and a fabrication method thereof according to the prior art.

Referring to FIG. 1A, a first substrate 10 having a plurality of first bonding pads 101 is provided. A plurality of first solder balls 11 are formed on the first bonding pads 101 and a gap d1 is formed between the first solder balls 11. A semiconductor chip 12 is disposed on the first substrate 10 through a plurality of solder balls 121, and an encapsulant 13 is formed on the first substrate 10 to encapsulate the semiconductor chip 12 and the solder balls 121. The encapsulant 13 has a plurality of openings 131 exposing top and side portions of the first solder balls 11. Further, a second substrate 14 having a plurality of second bonding pads 141 is provided and a plurality of second solder balls 15 are formed on the second bonding pads 141 and corresponding to the first solder balls 11.

Referring to FIG. 1B, a reflow process is performed to bond the first solder balls 11 and the corresponding second solder balls 15 together, thereby forming a plurality of conductors 16.

However, since the first solder balls 11 and the second solder balls 15 easily collapse during the reflow process, the height of the semiconductor package 1 or the gap 17 between the encapsulant 13 and the second substrate 14 is difficult to control. Further, solder bridging easily occurs between the first solder balls 11 or the second solder balls 15 so as to cause a short circuit. In addition, a large space is required at the joints between the first solder balls 11 and the second solder balls 15. Therefore, the semiconductor package 1 cannot meet the fin-pitch requirement.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a first semiconductor device having a first top surface and a first bottom surface opposite to the first top surface; a plurality of conductive balls formed on the first top surface of the first semiconductor device; a second semiconductor device having a second top surface and a second bottom surface opposite to the second top surface; and a plurality of conductive posts formed on the second bottom surface of the second semiconductor device and correspondingly bonded to the conductive balls for electrically connecting the first semiconductor device and the second semiconductor device, wherein the conductive posts have a height less than 300 um.

The present invention provides another semiconductor package, which comprises: a first semiconductor device having a first top surface and a first bottom surface opposite to the first top surface; a plurality of conductive balls formed on the first top surface of the first semiconductor device; a second semiconductor device having a second top surface and a second bottom surface opposite to the second top surface; and a plurality of conductive posts formed on the second bottom surface of the second semiconductor device and correspondingly bonded to the conductive balls for electrically connecting the first semiconductor device and the second semiconductor device, wherein each of the conductive posts is a cylinder having a height and a diameter and the height is greater than one half of the diameter.

The present invention provides a further semiconductor package, which comprises: a first semiconductor device having a first top surface and a first bottom surface opposite to the first top surface; a plurality of conductive balls formed on the first top surface of the first semiconductor device; a second semiconductor device having a second top surface and a second bottom surface opposite to the second top surface; and a plurality of conductive posts formed on the second bottom surface of the second semiconductor device and correspondingly bonded to the conductive balls for electrically connecting the first semiconductor device and the second semiconductor device, wherein each of the conductive posts is an elliptic cylinder having a long axis and a short axis, and the long axis is 1.1 times longer than 1.1 the short axis.

The present invention further provides a method for fabricating a semiconductor package, which comprises the steps of: providing a first semiconductor device having a first top surface and a first bottom surface opposite to the first top surface and a second semiconductor device having a second top surface and a second bottom surface opposite to the second top surface, wherein a plurality of conductive balls are formed on the first top surface of the first semiconductor device and a plurality of conductive posts are formed on the second bottom surface of the second semiconductor device, and the conductive posts have a height less than 300 um; and correspondingly bonding the conductive balls to the conductive posts for electrically connecting the first semiconductor device and the second semiconductor device.

The first semiconductor device or the second semiconductor device can be a substrate, an interposer, a semiconductor chip, a semiconductor wafer or a semiconductor package.

Each of the conductive balls can have a single-layer structure, a two-layer structure having an inner layer and an outer layer encapsulating the inner layer, or a three-layer structure having an inner layer, and a middle layer and an outer layer sequentially encapsulating the inner layer. Alternatively, each of the conductive balls can have at least a cylinder and an outer layer encapsulating the cylinder. The conductive balls can be made of Sn—Pb, Sn—Ag or Sn—Ag—Cu in various ratios.

In an embodiment, each of the conductive posts is a cylinder having a height and a diameter, and the height is greater than one half of the diameter. In another embodiment, each of the conductive posts is an elliptic cylinder having a long axis and a short axis, and the long axis is 1.1 times longer than the short axis. In other embodiments, each of the conductive posts is a polygonal column or a ball-shaped column.

In the above-described packages and method, an encapsulant can be formed between the first top surface of the first semiconductor device and the second bottom surface of the second semiconductor device for encapsulating the conductive balls and the conductive posts.

In the above-described packages and method, a semiconductor element can be disposed on the first top surface of the first semiconductor device and embedded in the encapsulant.

In the above-described packages and method, a protection layer can be formed in a gap between the semiconductor element and the second semiconductor device for protection, heat dissipation or electrical grounding.

In the above-described packages and method, a plurality of support elements can be formed between the first semiconductor device and the second semiconductor device for support, heat dissipation or electrical grounding.

In the above-described packages and method, at least an electronic element can be formed inside or on a surface of the first semiconductor device or the second semiconductor device.

According to the present invention, a plurality of conductive balls are formed on a top surface of a first semiconductor device and a plurality of conductive posts are formed on a bottom surface of a second semiconductor device. The conductive balls are correspondingly bonded to the conductive posts for electrically connecting the first semiconductor device and the second semiconductor device. The conductive posts have a height less than 300 um, or the height of each of the conductive posts is greater than one half of the diameter, or the long axis of the conductive post is 1.1 times longer than the short axis.

Therefore, during a reflow process, the conductive balls are melted and the conductive posts remain unchanged without collapsing. The conductive balls are correspondingly bonded to the conductive posts so as to prevent bridging or a short circuit from occurring between the conductive balls. Further, the present invention can easily control the height of the semiconductor package or a gap between the encapsulant and the second semiconductor device. Furthermore, the present invention is applicable to semiconductor packages having fine-pitch conductive balls. Also, the structure reliability of the semiconductor package is improved.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2E are schematic cross-sectional views showing a semiconductor package 2a and a fabrication method thereof according to a first embodiment of the present invention.

Figure 2A:
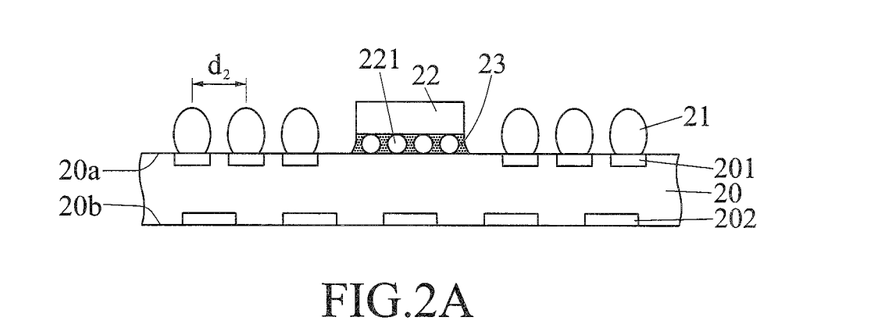
FIGS. 2A to 2E are schematic cross-sectional views showing a semiconductor package and a fabrication method thereof according to a first embodiment of the present invention.

Referring to FIG. 2A, a first semiconductor device 20 having a first top surface 20a and a first bottom surface 20b opposite to the first top surface 20a is provided. A plurality of first bonding pads 201 are formed on the first top surface 20a of the first semiconductor device 20 and a plurality of second bonding pads 202 are formed on the first bottom surface 20b of the first semiconductor device 20.

Then, a plurality of conductive balls 21 are formed on the first bonding pads 201 and a gap d2 is formed between the conductive balls 21. Further, a semiconductor element 22 such as a semiconductor chip is disposed on the first top surface 20a of the first semiconductor device 20 and electrically connected to the first semiconductor device 20 through a plurality of conductive elements 221 such as solder balls. Thereafter, an underfill 23 is formed between the semiconductor element 22 and the first top surface 20a of the first semiconductor device 20 for encapsulating the conductive elements 221.

The gap d2 between the conductive balls 21 can be less than the gap d1 between the first solder balls 11 of FIG. 1A. Further, the conductive balls 21 can be uniform balls and made of such as Sn—Pb, Sn—Ag or Sn—Ag—Cu in various ratios according to various specifications or melting-point requirements. For example, the conductive balls 21 can be made of 63Sn-37Pb, 90Sn-10Pb, 98Sn-2Ag, or 95.5Sn-4.0Ag-0.5Cu.

Referring to FIGS. 5A to 5D, each of the conductive balls 21 can have a single-layer structure, a two-layer structure having an inner layer and an outer layer encapsulating the inner layer, or a three-layer structure having an inner layer, and a middle layer and an outer layer sequentially encapsulating the inner layer, or each of the conductive balls 21 can have at least a cylinder and an outer layer encapsulating the cylinder.

Figure 2B:
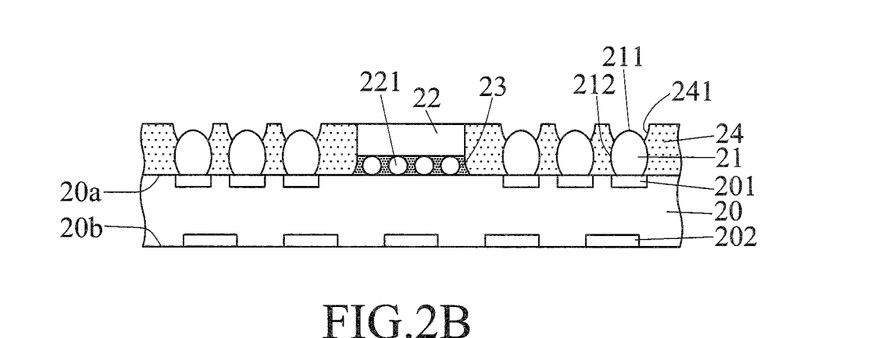

Referring to FIG. 2B, an encapsulant 24 is formed on the first top surface 20a of the first semiconductor device 20 for encapsulating the conductive balls 21, the semiconductor element 22, the conductive elements 221 and the underfill 23. As such, the semiconductor element 22 is embedded in the encapsulant 24. Further, an upper surface of the semiconductor element 22 can be exposed from the encapsulant 24. Then, by performing such as a laser ablation process, a plurality of openings 241 are formed in the encapsulant 24 to expose top portions 211 of the conductive balls 21. Preferably, the openings 241 of the encapsulant 24 are small and side portions 212 of the conductive balls 21 are not exposed from the openings 241.

Figure 2C:
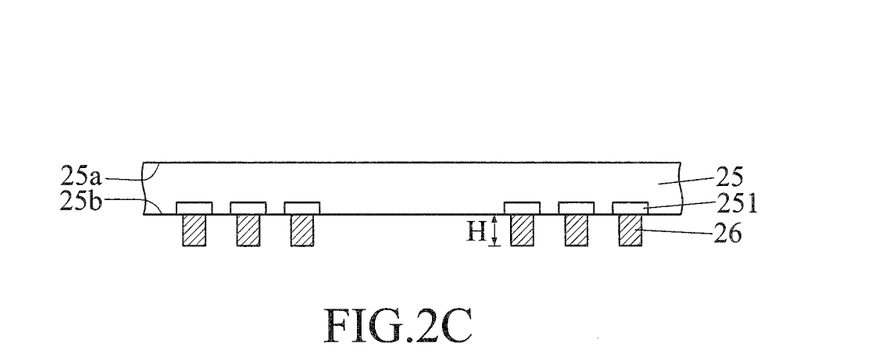

Referring to FIG. 2C, a second semiconductor device 25 having a second top surface 25a and a second bottom surface 25b opposite to the second top surface 25a is provided. A plurality of third bonding pads 251 are formed on the second bottom surface 25b of the second semiconductor device 25 and a plurality of conductive posts 26 are formed on the third bonding pads 251. The conductive posts 26 have a height H less than 300 um. The first semiconductor device 20 or the second semiconductor device 25 can be a substrate, an interposer, a semiconductor chip, a semiconductor wafer or a semiconductor package. The interposer can be a silicon-containing interposer, an inorganic interposer or an organic interposer.

Figure 6A:
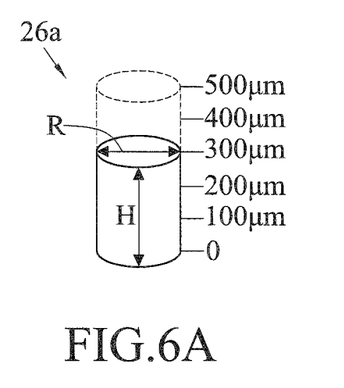
FIGS. 6A to 6C are schematic views showing various embodiments of conductive posts of the present invention.

Referring to FIG. 6A, in an embodiment, the conductive post 26a is a cylinder having a height H and a diameter R and the height H is greater than one half of the diameter R, i.e., H>½R. In another embodiment, referring to FIG. 6B, the conductive post 26b is an elliptic cylinder having a long axis and a short axis, and the length L of the long axis is 1.1 times greater than the length S of the short axis, i.e., L>1.1S. In other embodiments, each of the conductive posts 26 can be a polygonal column or a ball-shaped column. The conductive posts 26 can be made of a metal material or a conductive material, for example, copper, gold or an alloy. Further, an anti-oxidation layer (not shown), for example, an electroplated chromium layer or an organic solderability preservative (OSP) layer, can be formed on the conductive posts 26.

Figure 2D:
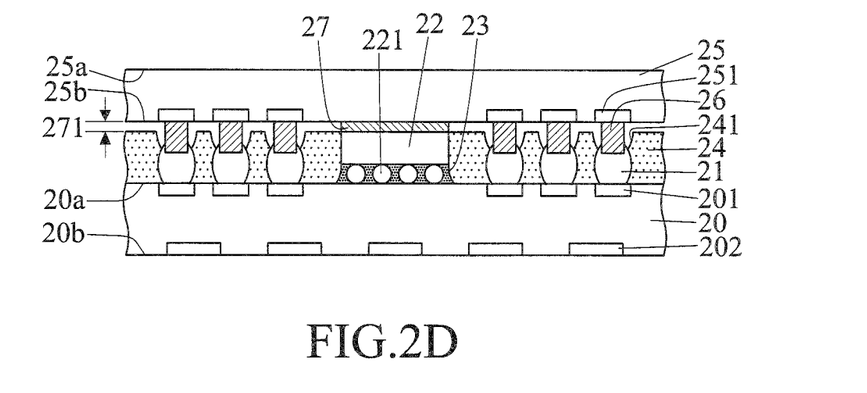

Referring to FIG. 2D, a reflow process is performed to melt the conductive balls 21 of the first semiconductor device 20 of FIG. 2B and correspondingly bond the conductive balls 21 to the conductive posts 26 of the second semiconductor device 25 of FIG. 2C, thereby electrically connecting the first semiconductor device 20 and the second semiconductor device 25.

Further, a protection layer 27 is formed in a gap 271 between an upper surface of the semiconductor element 22 and the second bottom surface 25b of the second semiconductor device 25. The protection layer 27 can be made of a non-conductive film, an adhesive film, prepreg, polyimide, a thermal adhesive or a grounding layer. The protection layer 27 can be used to protect the semiconductor element 22 against damage and increase the reliability of the overall structure of FIG. 2D. Also, the protection layer 27 can be used to facilitate heat dissipation of the semiconductor element 22 or electrically grounded to prevent electromagnetic interferences (EMIs) or electrostatic discharges (ESDs).

Figure 2E:
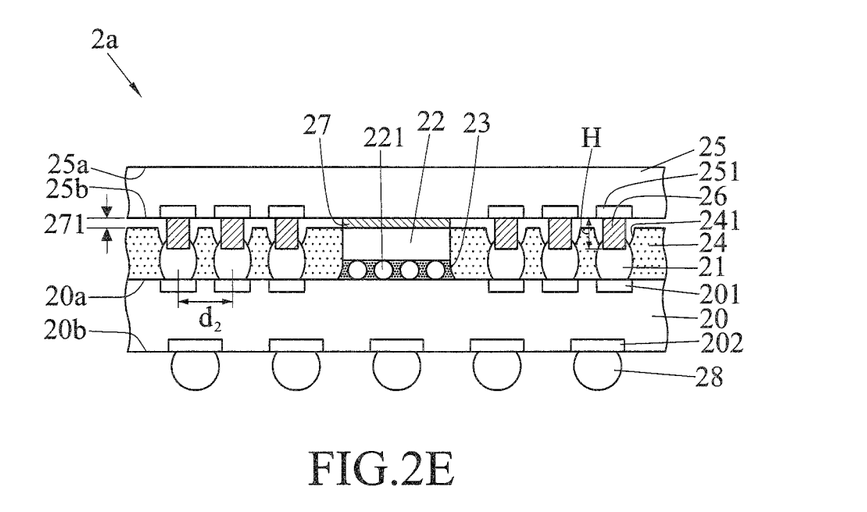

Referring to FIG. 2E, a plurality of solder balls 28 are formed on the second bonding pads 202 of the first semiconductor device 20. As such, a semiconductor package 2a is formed.

The present invention further provides a semiconductor package 2a of FIG. 2E, which has: a first semiconductor device 20 having a first top surface 20a having a plurality of first bonding pads 201 and a first bottom surface 20b opposite to the first top surface 20a and having a plurality of second bonding pads 202; a plurality of conductive balls 21 formed on the first bonding pads 201 of the first top surface 20a of the first semiconductor device 20; a second semiconductor device 25 having a second top surface 25a and a second bottom surface 25b opposite to the second top surface 25a and having a plurality of third bonding pads 251; and a plurality of conductive posts 26 formed on the third bonding pads 251 of the second bottom surface 25b of the second semiconductor device 25 and correspondingly bonded to the conductive balls 21 for electrically connecting the first semiconductor device 20 and the second semiconductor device 25, wherein the conductive posts 26 have a height less than 300 um.

A gap d2 is formed between the conductive balls 21. The gap d2 can be less than the gap d1 between the first solder balls 11 of FIG. 1A. The conductive balls 21 can be uniform balls and made of such as Sn—Pb, Sn—Ag or Sn—Ag—Cu in various ratios according to various specifications or melting-point requirements. For example, the conductive balls 21 can be made of 63Sn-37Pb, 90Sn-10Pb, 98Sn-2Ag or 95.5Sn-4.0Ag-0.5Cu.

Referring to FIGS. 5A to 5D, each of the conductive balls 21 can have a single-layer structure, a two-layer structure having an inner layer and an outer layer encapsulating the inner layer, or a three-layer structure having an inner layer, and a middle layer and an outer layer sequentially encapsulating the inner layer, or each of the conductive balls 21 can have at least a cylinder and an outer layer encapsulating the cylinder.

The first semiconductor device 20 or the second semiconductor device 25 can be a substrate, an interposer, a semiconductor chip, a semiconductor wafer or a semiconductor package. The interposer can be a silicon-containing interposer, an inorganic interposer or an organic interposer.

In an embodiment, each of the conductive posts 26a is a cylinder having a height H and a diameter R and the height H is greater than one half of the diameter R. In another embodiment, each of the conductive posts 26b is an elliptic cylinder having a long axis and a short axis, and the length L of the long axis is 1.1 times greater than the length S of the short axis. In other embodiments, each of the conductive posts 26 is a polygonal column or a ball-shaped column. The conductive posts 26 can be made of a metal material or a conductive material, for example, copper, gold or an alloy. Further, an anti-oxidation layer (not shown), for example, an electroplated chromium layer or an organic solderability preservative (OSP) layer, can be formed on the conductive posts 26.

The semiconductor package 2a can further have an encapsulant 24 formed on the first top surface 20a of the first semiconductor device 20 for encapsulating the conductive balls 21. Further, a plurality of openings 241 can be formed in the encapsulant 24 for exposing top portions 211 of the conductive balls 21.

The semiconductor package 2a can further have a semiconductor element 22 such as a semiconductor chip disposed on the first top surface 20a of the first semiconductor device 20 and embedded in the encapsulant 24. An upper surface of the semiconductor element 22 can be exposed from an upper surface of the encapsulant 24. The semiconductor element 22 is electrically connected to the first semiconductor device 20 through a plurality of conductive elements 221.

The semiconductor package 2a can further have an underfill 23 formed between the semiconductor element 22 and the first semiconductor device 20 for encapsulating the conductive elements 221.

Further, a protection layer 27 can be formed in a gap 271 between the upper surface of the semiconductor element 22 and the second bottom surface 25b of the second semiconductor device 25. The protection layer 27 can be made of a non-conductive film, an adhesive film, prepreg, polyimide, a thermal adhesive or a grounding layer. The protection layer 27 can be used to protect the semiconductor element 22 against damage and increase the structure reliability of the semiconductor package 2a. Also, the protection layer 27 can be used to facilitate heat dissipation of the semiconductor element 22 or electrically grounded to prevent electromagnetic interferences (EMIs) or electrostatic discharges (ESDs).

FIGS. 3A to 3E are schematic cross-sectional views showing a semiconductor package 2b and a fabrication method thereof according to a second embodiment of the present invention.

Figure 3A:
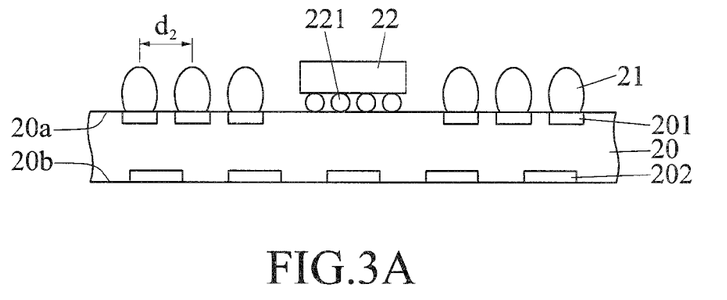
FIGS. 3A to 3E are schematic cross-sectional views showing a semiconductor package and a fabrication method thereof according to a second embodiment of the present invention.

Referring to FIG. 3A, a first semiconductor device 20 having a first top surface 20a and a first bottom surface 20b opposite to the first top surface 20a is provided. A plurality of first bonding pads 201 are formed on the first top surface 20a of the first semiconductor device 20 and a plurality of second bonding pads 202 are formed on the first bottom surface 20b of the first semiconductor device 20.

Then, a plurality of conductive balls 21 are formed on the first bonding pads 201 and a gap d2 is formed between the conductive balls 21. Further, a semiconductor element 22 such as a semiconductor chip is disposed on the first top surface 20a of the first semiconductor device 20 and electrically connected to the first semiconductor device 20 through a plurality of conductive elements 221 such as solder balls or bonding wires.

Figure 3B:
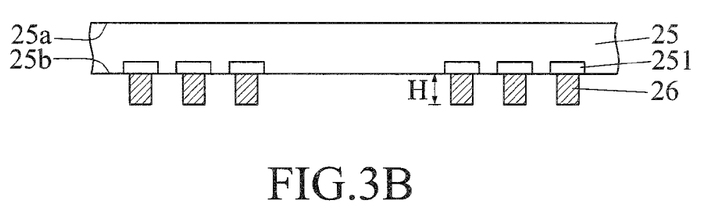

Referring to FIG. 3B, a second semiconductor device 25 having a second top surface 25a and a second bottom surface 25b opposite to the second top surface 25a is provided. A plurality of third bonding pads 251 are formed on the second bottom surface 25b of the second semiconductor device 25 and a plurality of conductive posts 26 are formed on the third bonding pads 251. The conductive posts 26 have a height H less than 300 um.

Figure 3C:
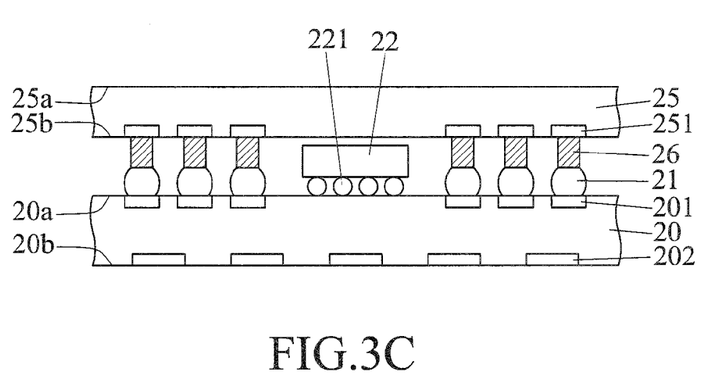

Referring to FIG. 3C, a reflow process is performed to melt the conductive balls 21 of the first semiconductor device 20 of FIG. 3A and correspondingly bond the conductive balls 21 to the conductive posts 26 of the second semiconductor device 25 of FIG. 3B, thereby electrically connecting the first semiconductor device 20 and the second semiconductor device 25.

Figure 3D:
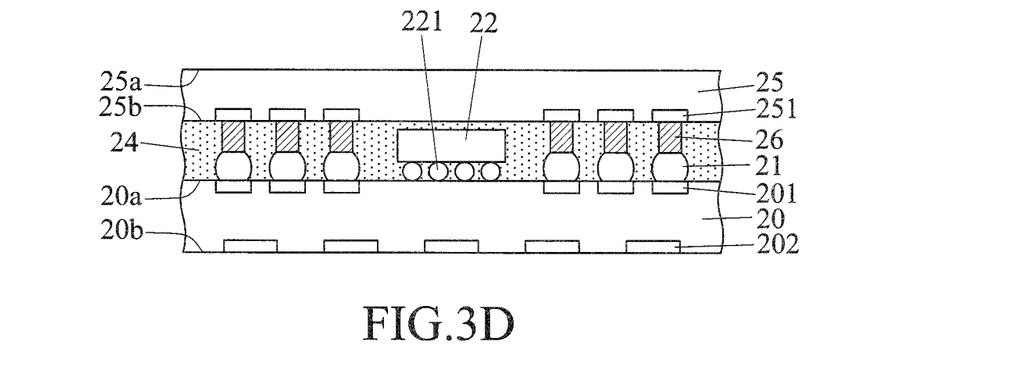

Referring to FIG. 3D, an encapsulant 24 having fine particles is formed between the first top surface 20a of the first semiconductor device 20 and the second bottom surface 25b of the second semiconductor device 25 for encapsulating the conductive balls 21, the conductive posts 26, the semiconductor element 22 and the conductive elements 221. Further, the underfill 23 of FIG. 2A is replaced with the encapsulant 24.

Figure 3E:
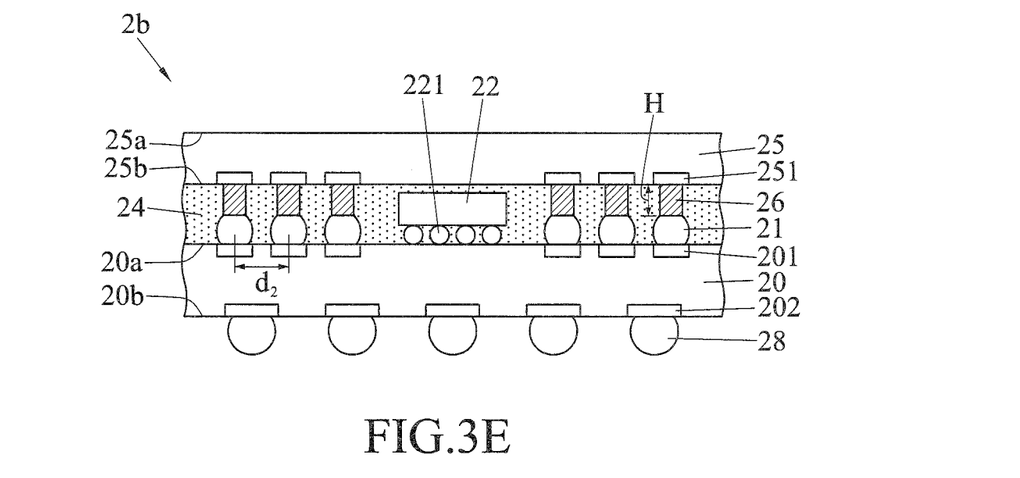

Referring to FIG. 3E, a plurality of solder balls 28 are formed on the second bonding pads 202 of the first semiconductor device 20. As such, a semiconductor package 2b is formed.

The present invention further provides a semiconductor package 2b of FIG. 3E. The semiconductor package 2b of FIG. 3E differs from the semiconductor package 2a of FIG. 2E in that the encapsulant 24 is formed between the first top surface 20a of the first semiconductor device 20 and the second bottom surface 25b of the second semiconductor device 25 for encapsulating the conductive balls 21, the conductive posts 26, the semiconductor element 22 and the conductive elements 221.

Therefore, in FIG. 3E, no gap is formed between the second bottom surface 25b of the second device 25 and the encapsulant 24. As such, the protection layer 27 of FIG. 2E can be omitted. Further, the underfill 23 of FIG. 2E can be omitted and the conductive elements 221 can be directly encapsulated by the encapsulant 24 having fine particles.

Figure 4A:
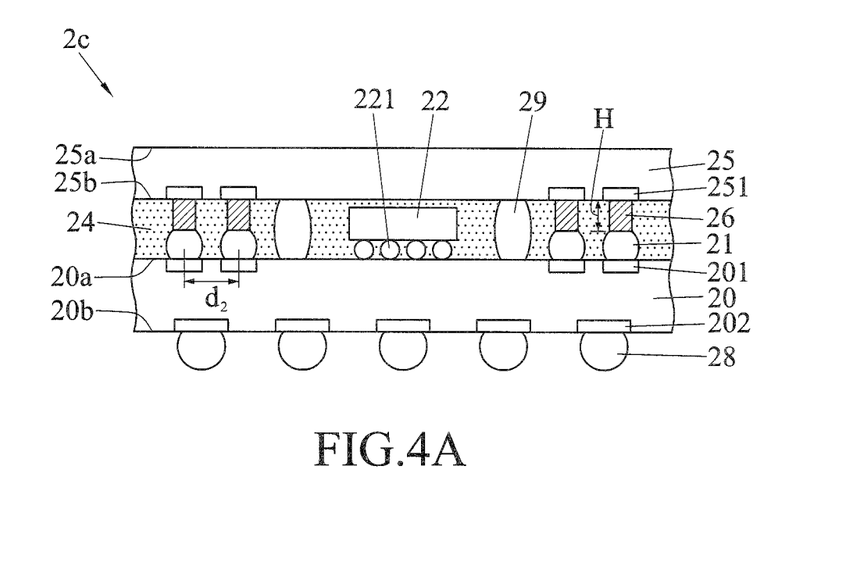
FIG. 4A is a schematic cross-sectional view of a semiconductor package according to a third embodiment of the present invention.

FIG. 4A is a schematic cross-sectional view of a semiconductor package 2c according to a third embodiment of the present invention. The semiconductor package 2c of FIG. 4A differs from the semiconductor package 2b of FIG. 3E in that a plurality of support elements 29 are formed between the first semiconductor device 20 and the second semiconductor device 25.

The support elements 29 can be used to support the second semiconductor device 25 so as to protect the semiconductor element 22 against damage and increase the structure reliability of the semiconductor package 2c. Also, the support elements 29 can be used to facilitate heat dissipation of the semiconductor element 22 or electrically grounded to prevent electromagnetic interferences (EMIs) or electrostatic discharges (ESDs).

The support elements 29 can also be formed between the first semiconductor device 20 and the second semiconductor device 25 of FIG. 2E.

Figure 4B:
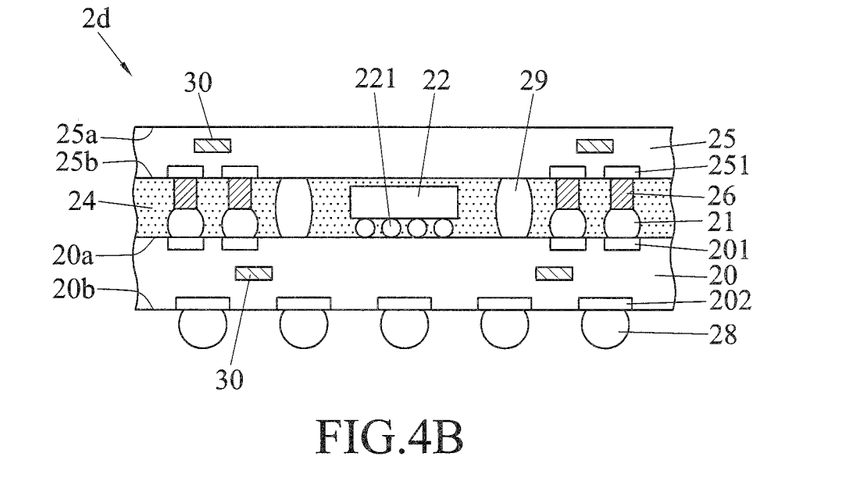
FIG. 4B is a schematic cross-sectional view of a semiconductor package according to a fourth embodiment of the present invention.

FIG. 4B is a schematic cross-sectional view of a semiconductor package 2d according to a fourth embodiment of the present invention. The semiconductor package 2d of FIG. 4B differs from the semiconductor package 2c of FIG. 4A in that at least an electronic element 30 is formed inside or on a surface (for example, the first top surface 20a, the first bottom surface 20b, the second top surface 25a or the second bottom surface 25b) of the first semiconductor device 20 or the second semiconductor device 25.

The electronic element 30 can also be formed inside or on a surface of the first semiconductor device 20 or the second semiconductor device 25 of FIG. 2E or FIG. 3E.

FIGS. 5A to 5D are schematic views showing various embodiments of the conductive balls 21a to 21d of the present invention.

Figure 5A:
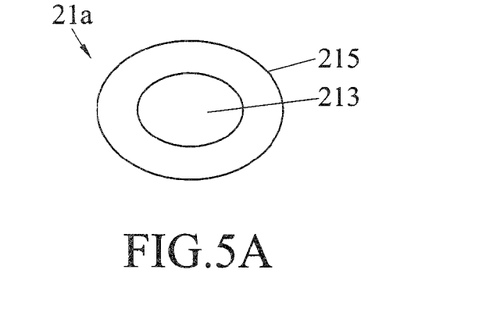
FIGS. 5A to 5D are schematic views showing various embodiments of conductive balls of the present invention.

Referring to FIG. 5A, the conductive ball 21a has a two-layer structure having an inner layer 213 and an outer layer 215 encapsulating the inner layer 213.

Figure 5B:
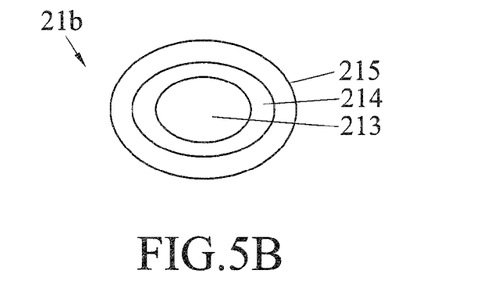

Referring to FIG. 5B, the conductive ball 21b has a three-layer structure having an inner layer 213, and a middle layer 214 and an outer layer 215 sequentially encapsulating the inner layer 213. The inner layer 213, the middle layer 214 and the outer layer 215 can be made of plastic, metal (except Sn) and Sn, respectively. The inner layer 213 made of plastic facilitates to reduce the cost.

Figure 5C:
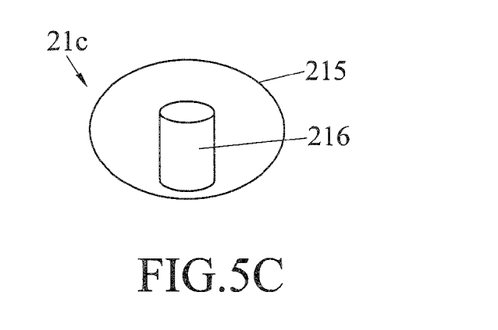

Referring to FIG. 5C, the conductive ball 21c has a cylinder 216 and an outer layer 215 encapsulating the cylinder 216.

Figure 5D:
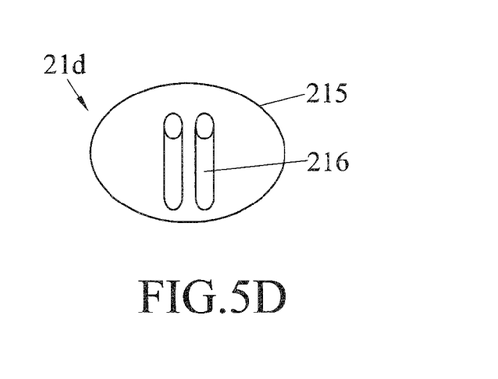

Referring to FIG. 5D, the conductive ball 21d has two cylinders 216 and an outer layer 215 encapsulating the two cylinders 216.

The inner layers 213 and cylinders 216 of FIGS. 5A to 5D facilitate to strengthen the structure of the conductive balls 21a to 21d and prevent the outer layers 215 from collapsing. The outer layers 215 of the conductive balls 21a to 21d can be melted so as to be bonded to the corresponding conductive posts 26.

Figure 6B:
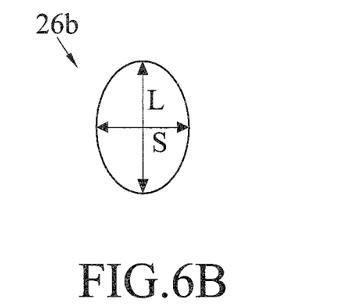
Figure 6C:
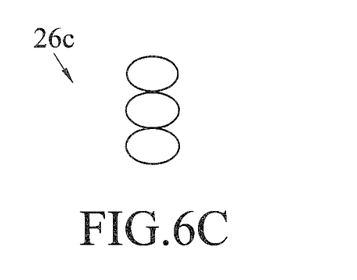

FIGS. 6A to 6C are schematic views showing various embodiments of the conductive posts 26a to 26c of the present invention.

FIG. 6A is schematic perspective view of the conductive post 26a. Referring to FIG. 6A, the conductive post 26a needs to have a certain height H (or length) to meet the fine-pitch requirement. Retelling to the following table and FIG. 6A, if the width (or diameter), shape and material of the conductive post 26a remain unchanged, the moment M of the conductive post 26a having a height H of 100 um is 100 F and the moment M of the conductive post 26a having a height H of 500 um is 500 F. Therein, F represents the force in Newton (N) and M represents the moment in Newton·meter (Nm). That is, the moment of the conductive post 26a having a height of 500 um is 5 times the moment of the conductive post 26 having a height of 100 um. Consequently, the conductive post 26a having a height of 500 um cracks easily.

| Height (H) | 100 | 200 | 300 | 400 | 500 |
|---|---|---|---|---|---|
| Moment (M) | 100 F | 200 F | 300 F | 400 F | 500 F |

It is verified through experiments that the conductive post 26a preferably has a height less than 300 um so as to prevent cracking and meet the fine-pitch requirement.

Referring to FIG. 6A, the conductive post 26a is a cylinder having a height H and a diameter R and the height H is greater than one half of the diameter R.

FIG. 6B is a schematic upper view of the conductive posts 26b. Referring to FIG. 6B, the conductive post 26b is an elliptic cylinder having a long axis and a short axis, and the length L of the long axis is 1.1 time greater than the length S of the short axis.

FIG. 6C is a schematic cross-sectional view of the conductive post 26c. Referring to FIG. 6C, the conductive post 26c is a ball-shaped column consisting of at least two balls stacked on one another.

According to the present invention, a plurality of conductive balls are formed on a top surface of a first semiconductor device and a plurality of conductive posts are formed on a bottom surface of a second semiconductor device. The conductive balls are correspondingly bonded to the conductive posts for electrically connecting the first semiconductor device and the second semiconductor device. The conductive posts have a height less than 300 um, or the height of each of the conductive posts is greater than one half of the diameter, or the long axis of the conductive post is 1.1 times longer than the short axis.

Therefore, during a reflow process, the conductive balls are melted and the conductive posts remain unchanged without collapsing. The conductive balls are correspondingly bonded to the conductive posts so as to prevent bridging or a short circuit from occurring between the conductive balls. Further, the present invention can easily control the height of the semiconductor package or a gap between the encapsulant and the second semiconductor device. Furthermore, the present invention is applicable to semiconductor packages having fine-pitch conductive balls. Also, the structure reliability of the semiconductor package is improved.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a first semiconductor device having a first top surface and a first bottom surface opposite to the first top surface;
   a plurality of conductive balls formed on the first top surface of the first semiconductor device;
   a second semiconductor device having a second top surface and a second bottom surface opposite to the second top surface; and
   a plurality of conductive posts formed on the second bottom surface of the second semiconductor device and correspondingly bonded to the conductive balls for electrically connecting the first semiconductor device and the second semiconductor device, wherein the conductive posts have a height less than 300 um.

2. The semiconductor package of claim 1, wherein the first semiconductor device or the second semiconductor device is a substrate, an interposer, a semiconductor chip, a semiconductor wafer or a semiconductor package.

3. The semiconductor package of claim 1, wherein each of the conductive balls has a single-layer structure, a two-layer structure having an inner layer and an outer layer encapsulating the inner layer, or a three-layer structure having an inner layer, and a middle layer and an outer layer sequentially encapsulating the inner layer.

4. The semiconductor package of claim 1, wherein each of the conductive posts is a cylinder, an elliptic cylinder, a polygonal column or a ball-shaped column.

5. The semiconductor package of claim 1, wherein each of the conductive posts is a cylinder having a height and a diameter, and the height is greater than a half of the diameter.

6. The semiconductor package of claim 1, wherein each of the conductive posts is an elliptic cylinder having a long axis and a short axis, and the long axis is 1.1 times longer than the short axis.

7. The semiconductor package of claim 1, further comprising an encapsulant formed between the first top surface of the first semiconductor device and the second bottom surface of the second semiconductor device for encapsulating the conductive balls and the conductive posts.

8. The semiconductor package of claim 1, further comprising a semiconductor element disposed on the first top surface of the first semiconductor device and embedded in an encapsulant.

9. The semiconductor package of claim 8, further comprising a protection layer formed in a gap between the semiconductor element and the second semiconductor device for protection, heat dissipation or electrical grounding.

10. The semiconductor package of claim 1, further comprising a plurality of support elements formed between the first semiconductor device and the second semiconductor device for support, heat dissipation or electrical grounding.

11. The semiconductor package of claim 1, further comprising at least an electronic element disposed inside or on a surface of the first semiconductor device or the second semiconductor device.

12. The semiconductor package of claim 1, wherein each of the conductive balls has at least a cylinder and an outer layer encapsulating the cylinder.

13. The semiconductor package of claim 1, further comprising a semiconductor element disposed on the first top surface of the first semiconductor device and embedded in an encapsulant, and a protection layer formed in a gap between the semiconductor element and the second semiconductor device for protection, heat dissipation or electrical grounding.

14. The semiconductor package of claim 1, further comprising a plurality of support elements formed between the first semiconductor device and the second semiconductor device for support, heat dissipation or electrical grounding.

15. A method for fabricating a semiconductor package, comprising the steps of:
   providing a first semiconductor device having a first top surface and a first bottom surface opposite to the first top surface and a second semiconductor device having a second top surface and a second bottom surface opposite to the second top surface, wherein a plurality of conductive balls are formed on the first top surface of the first semiconductor device and a plurality of conductive posts are formed on the second bottom surface of the second semiconductor device, and the conductive posts have a height less than 300 um; and
   correspondingly bonding the conductive balls to the conductive posts for electrically connecting the first semiconductor device and the second semiconductor device.

16. The method of claim 15, wherein each of the conductive balls has a single-layer structure, a two-layer structure having an inner layer and an outer layer encapsulating the inner layer, or a three-layer structure having an inner layer, and a middle layer and an outer layer sequentially encapsulating the inner layer.

17. The method of claim 15, wherein each of the conductive posts is a cylinder having a height and a diameter, and the height is greater than a half of the diameter.

18. The method of claim 15, wherein each of the conductive posts is an elliptic cylinder having a long axis and a short axis, and the long axis is 1.1 times longer than the short axis.

19. The method of claim 18, further comprising forming a protection layer in a gap between the semiconductor element and the second semiconductor device for protection, heat dissipation or electrical grounding.

20. The method of claim 15, further comprising forming a plurality of support elements between the first semiconductor device and the second semiconductor device for support, heat dissipation or electrical grounding.

\* \* \* \* \*